United States Patent [19]

Tamisier

[11] Patent Number: 5,594,656
[45] Date of Patent: Jan. 14, 1997

[54] METHOD OF VERIFICATION OF A FINITE STATE SEQUENTIAL MACHINE AND RESULTING INFORMATION SUPPORT AND VERIFICATION TOOL

[75] Inventor: Thomas Tamisier, St Germain en Laye, France

[73] Assignee: Bull S.A., Puteaux, France

[21] Appl. No.: 327,870

[22] Filed: Oct. 24, 1994

[30] Foreign Application Priority Data

Nov. 2, 1993 [EP] European Pat. Off. ............. 93402682

[51] Int. Cl.$^6$ .................................................. G06F 17/50
[52] U.S. Cl. ........................... 364/488; 364/489; 364/578
[58] Field of Search ..................................... 364/488, 489, 364/578

[56] References Cited

U.S. PATENT DOCUMENTS

| | | | |
|---|---|---|---|
| 5,331,568 | 7/1994 | Pixley | 364/489 |
| 5,394,347 | 2/1995 | Kita et al. | 364/578 |

OTHER PUBLICATIONS

Cabodi et al., "Cross–Fertilizing FSM Verification Techniques and Sequential Diagnosis," IEEE, 1992, pp. 306–311.
Langevin et al., "An Extended OBDD Representation for Extended FSMS" IEEE, 1994, pp. 208–213.
Ghosh, "Verification of Interacting Sequential Circuits," IEEE, 1990, pp. 213–219.
Aelten et al., "Verification of Relations between Synchronous Machines," IEEE, 1993, pp. 1947–1959.
Coudert et al., "Formal Boolean Manipulation for the Verification of Sequential Machines," IEEE, 1990, pp. 57–61.
IEE International Conference on Computer–Aided Design 11 Nov. 1990, Santa Clara US pp. 126–129 Coudert et al "A Unified Framework For The Formal Verification Of Sequential Circuits" p. 127, column 1, line 18; figures 1–2.
Proceedings 29th ACM/IEEE Design Automation Conference 8 Jun. 1992, Anaheim CA US, pp. 614–619 Cabodi et al "A New Model For Improving Symbolic Product Machine Traversal" the whole document.
WO–A–92 18944 (Siemens Aktiengesellschaft) 29 Oct. 1992, p. 11, line 34 – p. 15, line 18.

Primary Examiner—Kevin J. Teska
Assistant Examiner—Thai Phan
Attorney, Agent, or Firm—Kerkam, Stowell, Kondracki & Clarke, P.C.; Edward J. Kondracki

[57] ABSTRACT

The method of computing the reverse image of the transition function $\Delta(\delta, \delta')$ of a product finite state machine (PFSM): $\Delta^{-1}(E_{n-1})$ from the set of n-1 equivalent states comprises the steps of (a) constructing in a canonical way, from the BDD of the graph of the equivalence relation $E_{n-1}$, the BDD of the graph of a total function from S into S, named cross-section and denoted $C(E_{n-1})$, (b) constructing from the cross-section and vector $\delta$ a new vector $\delta^{n-1}=C(E_{n-1}) \circ \delta$, and (c) computing the equivalent pairs of states with respect to the vector $\delta^{n-1}$ to have the pairs of $(\forall x \Delta^{-1}(E_{n-1}))$.

21 Claims, 1 Drawing Sheet

METHOD OF VERIFICATION OF A FINITE STATE SEQUENTIAL MACHINE AND RESULTING INFORMATION SUPPORT AND VERIFICATION TOOL

FIELD OF THE INVENTION

The invention relates to a method of verification of a finite state sequential machine and more particularly to a method of computing by means of a computer an equivalence relation of a finite state machine. It also relates to an information support incorporating a program carrying out the method of the invention and a verification tool carrying out the method.

The design of very large integration circuits requires zero-defect circuits because prototyping is very expensive to debug circuits. Hardware design and verification use an abstract description of a circuit realization (hardware device) and a circuit specification (expected behaviour) in the shape of a finite automaton, called finite state machine or FSM. The finite state machine is obtained from a description in an hardware description language (e.g., VHDL) of the circuit realization or the circuit specification by abstraction tools. The finite state machine performs the comparison by equivalence or implication of the circuit realization with the circuit specification. An example of a finite state machine is described in publication (1): Workshop on Automating Verification Method for Finite State Systems, Grenoble, July 1989, "Verification of Synchronous Sequential Machines Based on Symbolic Execution", Coudert et al. In a finite state machine is used a method of computing equivalence relations, in particular the observable equivalence. A present application of observable equivalence in hardware design and verification is mainly the tool called Auto/Autograph as described for example in Proceedings of the DIMACS Workshop on Computer-Aided Verification, Vol. 3, DIMACS Series in Discrete Mathematics and Theoretical Computer Science, 1990, pages 477–492, Roy et al. "Auto/Autograph". This tool allows a reduction of complexity of reachable states from the initial states while minimizing the number of state variables, which results in hardware design in a reduction of the number of state registers in a circuit.

Figure 1:
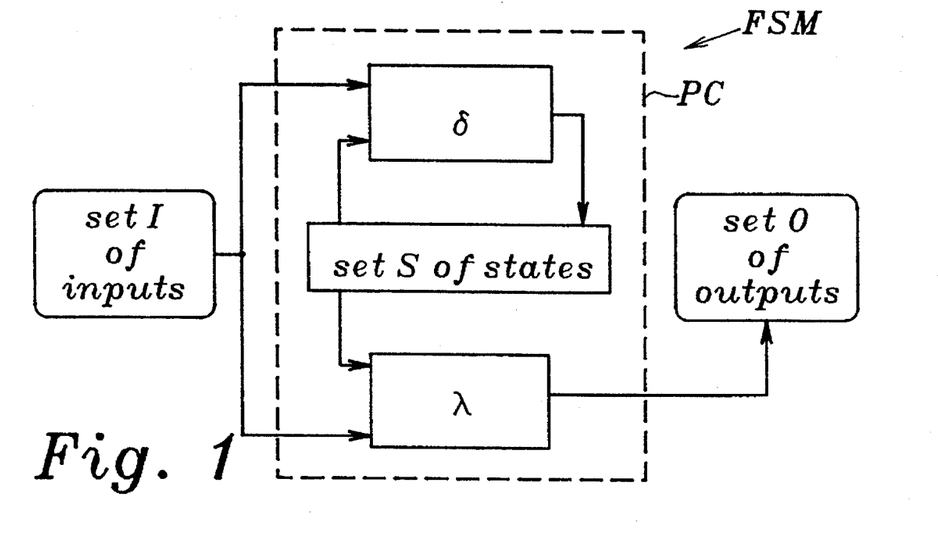
FIG. 1 is a block diagram of a finite state machine.

In FIG. 1 is a block diagram illustrating the operation of a finite state machine FSM. It uses three sets and two functions. The three sets comprise a set of inputs, named I, a set of states, named S, and a set of outputs, named O, and the functions comprise a transition function $\delta$ of the type $I \times S \to S$ and an output function $\lambda$ of the type $I \times S \to O$. The three sets I, S and O are finite sets and made of inputs x, states s and outputs o, respectively. In the machine as illustrated in FIG. 1, the transition function $\delta$ uses the set I of inputs as a first input and the set S of states as a second input to provide an output to the set S of states. The output function $\lambda$ uses the set I of inputs as a first input and the set S of states as a second input to provide an output to the set O of outputs. The transition function $\delta$, the output function $\lambda$, and the set of states operate as a processing circuit PC. In operation, the machine FSM is initially in a predetermined state and input sequences from the set I of inputs are successively applied to the two functions. In response to each input sequence, the machine computes a state s from the input sequence, the current state and the transition function $\delta$ while computing an output o from the input sequence, the current state and the output function $\lambda$ and switching into the state s.

Also, it can be said that the machine FSM produces a sequence of n outputs in response to a sequence of n inputs. In the following example:

| | | |
|---|---|---|
| $\{s_1, s_2\} \subseteq S$ | and $\delta: (s_1, s_2) \to s_2$ | and $\lambda: (s_1, x_1) \to o_2$ |
| $\{x_1, x_2\} \subseteq I$ | $\delta: (s_2, x_1) \to s_1$ | $\lambda: (s_2, x_1) \to o_2$ |
| $\{o_1, o_2\} \subseteq O$ | | $\lambda: (s_1, x_2) \to o_1$ | then the machine FSM produces the sequence "$o_2 o_2 o_1$" from the sequence "$x_1 x_1 x_2$" when the state is $s_1$.

The invention relates to the problem of computation of the observable equivalence relation of a machine FSM. It will be assumed that the machine has the state s and produces a sequence of m outputs $O=(o_1, \ldots, o_m)$ in response to a sequence of m inputs $X=(x_1, \ldots, x_m)$. The observable equivalence is the equivalence for the states with regard to the produced outputs. Two states s and s' are said to be equivalent if, from states s and s', the machine always produces the same output sequence in response to the same input sequence of any length. Two states s and s' are said to be k-equivalent (where k is an integer $\geq 1$) if they are equivalent for any sequence of a length $\leq k$. The set of equivalent (respectively k-equivalent) state pairs is denoted E (respectively $E_k$). We assume that for any $j \leq i$ the set $E_i$ is included in $E_j$. In other words, if i<j: $E \subset E_j \subset E_i \subset S \times S$.

Furthermore, the invention is concerned with a data structure based on boolean functions. A boolean function is of the type $f(x_1, \ldots, x_n): \{0, 1\}^n \to \{0, 1\}$. An identity is known between the boolean function f and the set of variables $X \subset \{0, 1\}^n$: $X=\{(x_1, \ldots, x_n) | f(x_1, \ldots, x_n)=1\}$, so that every set can be represented by its characteristic function and both are denoted by the same symbol. Let $\psi$ be a boolean function and $v_1, v_2, \ldots, v_n$ its variable support. Also, let $\psi[v_i \leftarrow 0]$ be the formula in which the variable $v_i$ is replaced by the constant 0 and O an order on $v_1, v_2, \ldots, v_n$ here considered as $v_1 < v_2 < \ldots < v_n$. Then a graph currently named Shannon's tree of $\psi$ in the ordering O and denoted $A(\psi)$ can be built in compliance with the two following rules. First, the tree of constants are the leaves "true" and "false" and, second, the tree has a single root labelled by the variable $v_1$. From the root grow two branches, i.e. a branch aiming in the right direction on the tree of $\psi [v_i \leftarrow 0]$ and a branch aiming in the left direction on the tree of $\psi[v_i \leftarrow 1]$. Two equivalent boolean functions have the same Shannon's tree modulo an ordering on the set of boolean variables and the choice of a variable support. From Shannon's tree $A(\psi)$ a boolean function is commonly represented by Bryant's binary decision diagram currently named BDD of $\psi$ for the ordering O and described in publication (2) IEEE Transactions on Computers, C-35(8), August 1986, pages 677–691, R. E. Bryant: "Graph-Based Algorithms for Boolean Function Manipulation". In brief, as described in this publication, a BDD of $\psi$ for the ordering O is obtained from Shannon's tree by application until exhaustion of two reduction rules: (1) redundant node elimination and (2) equivalent subgraph share. The BDD is obtained regardless of the order of application of the two rules. As a result of redundant node elimination, the BDD has a stronger canonicity property than that of Shannon's trees since it does not refer to a variable support. Two equivalent functions for a predetermined ordering on the set of boolean variables have the same BDD. For example, $\neg v_1 \vee v_1$ and $\neg v_2 \vee v_2$ have the same BDD.

The transition function is a vector $\delta: \{0, 1\}^n \to \{0, 1\}^k$. It is a vector of k boolean functions $\delta=(\delta_1, \ldots, \delta_k)$, with $\delta_i: \{0, 1\}^n \to \{0, 1\}$. In other words, $\delta(x_1, \ldots, x_n)=[\delta_1, \ldots, x_n), \ldots, \delta_k(x_1, \ldots, x_n)]$.

Figure 2:
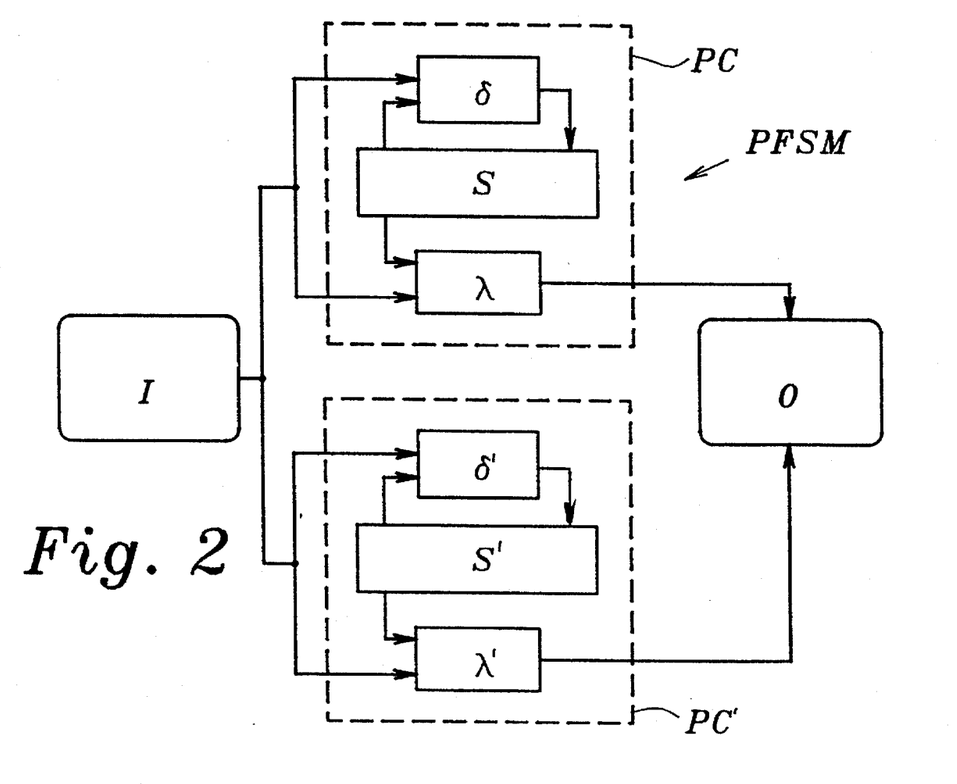
FIG. 2 is a block diagram of a product finite state machine.

More generally, a completely specified finite state machine is a 5-tuple $M=(I, O, S, \delta, \lambda)$. The set $I:=\{0, 1\}^k$ is the input space, the set $O=\{0, 1\}^l$ is the output space and the set $S=\{0, 1\}^n$ is the state space. Each state variable $s_j$ is associated with a boolean function $\delta_j$ from $S \times I$ to $\{0, 1\}$ and each output variable $o_j$ is associated with a boolean function $\lambda_j$ from $S \times I$ to $\{0, 1\}$. The vector $\delta=(\delta_j)$ is the transition function from $S \times I$ to $S$ and the vector $\lambda=(\lambda_j)$ is the output function from $S \times I$ to $O$. The symbols $s_1, \ldots, s_n$ are used to denote the boolean state variables and $x_1, \ldots, x_k$ to denote the boolean input variables. The vector $[s_1, \ldots, s_n]$ is written s as well. In other words, $I=\{0, 1\}^k$ encoded on variables $x_1, \ldots, x_k$ $O=\{0, 1\}^l$ encoded on variables $o_1, \ldots, o_l$ $S=\{0, 1\}^n$ encoded on variables $s_1, \ldots, s_n$ $\delta(s_1, \ldots, s_n, x_1, \ldots, x_k): \{0, 1\}^{n+k} \to \{0, 1\}^n = (\delta_1, \ldots, \delta_n)$ with $\delta_i(s_1, \ldots, s_n, x_1, \ldots, x_k): \{0, 1\}^{n+k} \to \{0, 1\}$ $\lambda(s_1, \ldots, s_n, x_1, \ldots, x_k): \{0, 1\}^{n+k} \to \{0,1\}^l = (\lambda_1, \ldots \lambda_l)$ with $\lambda_i(s_1, \ldots, s_n, x_1, \ldots, x_k): \{0,1\}^{n+k} \to \{0,1\}$ In FIG. 2 is illustrated the structure of a product finite state machine referenced PFSM and here-under also named product machine. It is an intuitive and sequential object as that illustrated in FIG. 1. The product machine is similar to that illustrated in FIG. 1 in which processing circuit PC is duplicated to have a second processing circuit PC' connected parallel to first processing circuit PC between set I of inputs and set O of outputs. More specifically, the first processing circuit PC comprises a first transition function $\delta$, a first output function $\lambda$ and a first set S of states s while the second processing circuit PC' comprises a second transition function $\delta'$, a second output function $\lambda'$ and a second set S' of states s'. The first and second transition functions and the first and second output functions are connected to set I of inputs and respective sets S, S' of states while the outputs of first and second output functions are connected to set O of outputs.

Let s and s' be a pair of states, they are equivalent if the processing circuits having the respective states s and s' produce same outputs in response to same inputs. The product machine is used to determine whether a pair of states s and s' is made of equivalent states. The determination is made by concatenating the machine of FIG. 1. Let $S=\{0, 1\}^n$ be encoded by the variables $s_1, \ldots, s_n$. Let $s'_1, \ldots, s'_n$ be n variables not used in the original machine. We denote the subset of pairs by BDD's on $s_1, \ldots, s_n, s'_1, \ldots, s'_n$. For each boolean function $\delta_i$, the function $\delta'_i$ is obtained by substituting the variables $s'_1, \ldots, s'_n$ for the variables $s_1, \ldots, s_n$, respectively. Similarly, for each boolean function $\lambda_i$, the function $\lambda'_i$ is obtained by substituting the variables $s'_1, \ldots, s'_n$ for the variables $s_1, \ldots, s_n$, respectively. Then, $\delta'_i(s'_1, \ldots, s'_n, x_1, \ldots, x_k) = \delta_i([s_1 \leftarrow s'_1], \ldots, [s_n \leftarrow s'_n])$ $\lambda'_i(s'_1, \ldots, s'_n, x_1, \ldots, x_k) = \lambda_i([s_1 \leftarrow s'_1], \ldots, [s_n \leftarrow s'_n])$ The transition function of the product machine is denoted $\Delta=(\delta_1, \ldots, \delta'_1, \ldots, \delta_n, \delta'_1, \ldots, \delta'_n)$ and $\Delta(s_1, \ldots, s_n, s'_1, \ldots, s'_n, x_1, \ldots, x_k):\{(0, 1\}^{n+n+k} \to \{0,1\}^{n+n}$ The output function of the product machine is denoted $\Lambda=(\lambda_1, \ldots, \lambda_l, \ldots, \lambda'_1, \ldots, \lambda'_n)$ and $\Lambda(s_1, \ldots, s_n, s'_1, \ldots, s'_n, x_1, \ldots, x_k): \{0,1\}^{n+n+k} \to \{0,1\}^{l+l}$ Thus, the product machine is a 5-tuple $M'=(I, [O \times O], [S \times S], \Delta, \Lambda)$.

As other well known definitions, let $\delta$ be a boolean function and x a variable, the following notations are used:

$\forall x \delta = \delta(x \leftarrow 0) \land \delta(x \leftarrow 1)$ $\exists x \delta = \delta(x \leftarrow 0) \lor \delta(x \leftarrow 1)$ in which x can be a vector of boolean variables.

Also, let $\delta$ be a boolean function $\delta: \{0, 1\}^n \to \{0, 1\}^k$ and $P \subset \{0, 1\}^k$ then the reverse image is $\delta^{-1}(P) \subset \{0, 1\}^n = \{(x_1, \ldots, x_n) | \delta(x_1, \ldots, x_n) \in P\}$ Once the product machine is constructed, each state in the product machine actually represents a pair of states s, s' for the machine. The goal is to compute the BDD on the variables $s_1, \ldots, s_n, s'_1, \ldots, s'_n$, of the equivalent state pairs in which the first component is encoded on the variables $s_1, \ldots, s_n$ and the second component is encoded on the variables $s'_1, \ldots, s'_n$. In the prior art, an algorithm is used to get the equivalent state pairs. This algorithm consists in successively constructing the BDD's of the sets $E_j$ until the fixpoint is reached. The fixpoint of a function f is the element x: $f(x)=x$. Here the fixpoint is reached when $E_n=E_{n+1}=E$ and is obtained by computing the $E_j$ suite as follows:

$$E_1(s, s') = \forall x \bigwedge_{j \leq 1} (\lambda_j(s, x) \Leftrightarrow \lambda_j'(s', x))$$

$$E_n = E_l \land (\forall x \Delta^{-1}(E_{n-l}))$$

This computation is based on a good variable ordering for the BDD's of the sets $E_j$, which must be compatible with the relation corroborated by the experimentation:

$$\{s_1, s'_1\} < \{s_2, s'_2\} < \ldots < \{s_n, s'_n\}$$

Intuitively, such an ordering makes the most of the two following facts: the sets $E_j$ are graphs of equivalence relations and the original ordering of the sate space is $s_1 < s_2 < \ldots < s_n$.

The computation of the set $E_1$ requires only boolean operations on BDD's, that are quadratic operations, and an elimination of variables. Experimental tests stipulate that the construction of set $E_1$ is generally performed at a low cost when the above variable ordering is chosen. To compute the set $E_n$ from $E_{n-}$, we have to calculate the reverse image of $E_{n-1}$ by vector $\Delta$ and to perform a universal elimination of the input variables. The reverse image computation can be performed using several methods. One involves the construction of the graph of the transition function, but this graph cannot be built for very large machines FSM. Another method (called substitution method) consists in replacing each of variables $s_1, s'_1, \ldots, s_j, s'_j, \ldots$ by the corresponding $\delta_1, \delta'_1, \ldots, \delta_j, \delta'_j, \ldots$. There exist some implementations that perform simultaneously this substitution and elimination of the input variables. An example of this prior method is described in the above-cited publication (1).

The computation of reverse image by the substitution method is made by an algorithm having an exponential complexity. Moreover, the vector $\Delta$ comprises 2n functions $(\delta, \delta')$ and the reverse image is computed from the set $E_{n-1}$ having 2n boolean variables. Thus the computation of $\Delta^{-1}(E_n)$ is a long time consuming step and requires a large memory space.

The present invention relates to a new method of computing $\Delta^{-1}(En)$, which corresponds to a new computation of the fixpoint reached when $E_n=E_{n+1}=E$. It overcomes the drawbacks of the prior art in allowing computation in a short time using a substantially less large memory space.

More generally, the invention provides a method of verification of a finite state sequential machine, comprising computing by means of a computer a set Y defined from two finite sets B and S encoded on boolean variables, a function $\delta: B \to S$ expressed by a vector of boolean functions, and an equivalence relation A on S, the set B being encoded on variables $s=s_1, \ldots, s_n$ and $x=x_1, \ldots, x_k$, in which x can be void, and $Qx_i$ designating either $\exists x_i$ or $\forall_i$, so that:

$Y=\{(s,s')\epsilon(\exists x_1, \ldots, \exists x_k B)^2 | Qx_1, \ldots, Qx_k [(\delta(s,x), \delta(s',x))\epsilon A]\}$, characterized in that the computation of set Y comprises the steps of (a) constructing in a canonical way, from the BDD of the graph of the equivalence relation A, the BDD of the graph of a total function from S×S, named cross-section and denoted C(A), (b) constructing from the cross-section and the vector $\delta$ a new vector denoted $\delta^* = C(A) \circ \delta$, and (c) computing the pairs (s, s') such that $Qx1, \ldots Qxk \cdot (\delta^*(s, x) = \delta(s', x))$.

More particularly, the method is used to compute an equivalence relation E of a finite state machine (FSM), the equivalence relation E being defined as the fixpoint of a monotonic suite $E_1, \ldots, E_n = E$, the computation of the equivalence relation E being made by successively construct the set $E_n$ by use of the reverse image of the set $E_{n-1}$ defined in terms of said set Y.

One result is an information support incorporating a computer program carrying out the method of the invention.

A second result is a tool of verification of a finite state sequential machine carrying out the method of the invention.

BRIEF DESCRIPTION OF THE DRAWING

The objects and advantages of the invention will become clearly apparent from the following description of a preferred embodiment of the invention referring to the appended drawings.

In the drawings.

The underlying idea of the present invention is based on the fact that the set $\Delta^{-1}(E_n)$ is the graph of an equivalence relation on S×S. To obtain set $E_1$, all the pairs of states having the same image by $\delta$ are to be found. To find them, the invention is directed to find from the set $E_{n-1}$ a vector $\theta$ having the following property:

$$[\theta(s) = \theta(s')] \Leftrightarrow [(s,s') \epsilon \Delta^{-1}(E_{n-1})]$$

With the vector $\theta$ can be constructed $\Delta^{-1}(E_n)$ in the same manner as set $E_1$ is built from output function $\lambda$.

SUMMARY OF THE INVENTION

The present invention relates to a method of computing the reverse image of the transition function of a product finite state machine from the set of n−1 equivalent states, that is a method of computing $\Delta^{-1}(E_{n-1})$, comprising the steps of:

(a) constructing in a canonical way, from the BDD of the graph of the relation $E_{n-1}$, the BDD of the graph of a total function from S×S, named cross-section and denoted $C(E_{n-1})$, and (b) constructing from the cross-section and the vector $\delta$ a new vector denoted $\delta^{n-1} = C(E_{n-1}) \circ \delta$. It will be shown that the new vector has the desired properties of the above vector $\theta$. Thus this vector is obtained by a modification of the transition function $\delta$ with the help of the set $C(E_{n-1})$. Although the reverse image computation algorithm is used, the sets whose reverse image is now computed are subsets of S (encoded by the variables $s_1, s_2, \ldots, s_n$) instead of the set $E_{n-1}$ of state pairs (encoded by the variables $s_1, s_2, \ldots, s_n$, $s'_1, s'_2, \ldots, s'_n$) as in the prior method.

Then the method of the invention can comprise a third step (c) of computing the equivalent pairs of states with respect to the vector $\delta^{n-1}$. These pairs are exactly the elements of $(\forall x(\Delta^{-1}(E_{n-1})))$. However, it is clear that the third step can be used to compute any existential or universal elimination of the variables in computing the reverse image by use of the method of the invention. In other words, instead of the step (c) used to compute the elements of $(\forall x(\Delta^{-1}(E_{n-1})))$ an alternative third step (c') can be used to compute the elements of $(\exists x(\Delta^{-1}(E_{n-1})))$.

The canonical cross-section $C(E_{n-1})$ defined in step (a) can be computed by using various methods. Here is presented a canonical way to obtain a graph of a function C(R) from a graph of a relation R. The function C(R) is called the cross-section of the relation R. The definition that will be given is a particular case of a method introduced in publication (3) Research Report, University of California, Berkeley, 1992, B. Lin and A. Richard Newton: "Implicit Manipulation of Equivalence Classes Using Binary Decision Diagrams", known under the name of compatible projection.

It will be assumed that all the elements of a set $\{0, 1\}^n$ are ordered by the increasing order of integers. For instance, the element $(0, 0, \ldots, 1)$ represented by $(\neg s_1 \wedge \neg s_2 \wedge \ldots \wedge \neg s_{n-1} \wedge s_n)$ is the predecessor of $(0, 0, \ldots 1, 0)$ represented by $(\neg s_1 \wedge \neg s_2 \wedge \ldots \wedge s_{n-1} \wedge \neg s_n)$.

Definition 1: Let B and C be two sets and $\psi$ a relation from B into C and let $\leq$ be a total order on C, then the cross-section of $\psi$ is the partial function $C(\psi)$ defined as:

$$C(\phi): \quad |B \to C$$
$$|x \mapsto \min(\{y | (x, y) \in \phi\})$$

To compute the cross-section of relation $E_{n-1}$, the variables of the codomain are $s_1, \ldots, s_n$ and the variables for the domain are $s'_1, \ldots, s'_n$. From the BDD of $E_{n-1}$ can be recursively constructed the BDD of $C(E_{n-1})$ applying the following transformation that remove from the BDD of $E_{n-1}$ the pairs that are not in $C(E_{n-1})$, which is the following algorithm 1.

```
CrossSection (bdd) {
    if((bdd == true) || (bdd == false))
        return(bdd);
    if(bdd == [s_i, left, right])
        return([s_i, C(left), C(right)]),
    if(bdd == [s'_i, left, right]) {
        aux = ¬∃s'_1, ..., s'_n(left);
        return([s'_i, C(left), C(right) ∧ aux]);
    }
}
```

This construction can be performed by a unique traversal of the graph of $E_{n-1}$, provided intermediate results are stored in the graph nodes.

Then, according to the second step (b) of the method of the invention, the composition $C(E_{n-1}) \circ \delta$ denoted $\delta^{n-1}$ is to be constructed. The construction could be made by using different methods. The following example is a method proceeding by separately modifying each of the original function $\delta_j$ of $\delta$ using the BDD of $C(E_{n-1})$.

The function $\delta$ is given as a vector of boolean functions $(\delta_1, \ldots, \delta_n)$ and the $\delta_j$ are on the state variables $s_i$ and the input variables $x_i$. The vector $\delta^{n-1} = \delta_1^{n-1}, \ldots, \delta_n^{n-1}$) is built on the same variables, and we must have $\delta^{n-1}(s, x) = C(E_{n-1}) \delta(s, x)$. Since $E_{n-1}$ is an equivalence relation, it is trivial to verify that $C(E_{n-1})$ is a function defined everywhere. Consequently, the composition $\delta^{n-1}$ is defined everywhere, as $\delta$ is.

Let s be in S and $K_i$ (s) denote the value of the component $s_i$ of s. For example, $K_3([0, 1, 1, 0])$ is 1. The function $\delta_j^{n-1}$ can be defined by the following equation, for j=1 to n:

$$\delta_j^{n-1}(s, x) = K_j(C(E_{n-1})(\delta(s,x)))$$

Let us consider the BDD G of the graph of cross-section $C(E_{n-1})$. For j from 1 to n we construct the set $$D_j = (\exists s'(\neg(s_j \Leftrightarrow s'_j) \wedge G)$$

$D_j \subset S$ includes all the states s such that $K_j(s) \neq K_j(G)$. The $\delta_j^{n-1}$ are obtained using the following theorem.

Theorem 1: Let F be the vector $C(E_{n-1})$, then F o $\delta = \delta_{n-1} = (\delta_1^{n-1}, \ldots, \delta_n^{n-1})$ can be defined as $$\delta_j^{n-1} = \neg(\delta_j \Leftrightarrow \delta^{-1}(D_j))$$

As a proof, it is checked that $\delta_j^{n-1}(s, x) = K_j[F(\delta(s,x))]$ by cases, depending on the values of $K_j(\delta(s, x))$ and $K_j[F(\delta(s, x))]$:

$K_j(\delta(s, x)) = 0$ and $K_j[F(\delta(s, x))] = 0$. Since $\delta(s, x)$ is not in $D_j$ and (s, x) is not in $\delta^{-1}(D_j)$ and since $\delta(s, x)$ is not in $\delta$, $\delta_j^{n-1}(s, x) = 0$.

$K_j(\delta(s, x)) = 0$ and $K_j[F(\delta(s, x))] = 1$. Since $\delta(s, x)$ is in $D_j$ and (s, x) is not in $\delta^{-1}(D_j)$ and since $\delta(s, x) = 0$ we have $\delta_j^{n-1}(s, x) = 1$.

$K_j(\delta(s, x)) = 1$ and $K_j[F(\delta(s, x))] = 0$. Since $\delta(s, x)$ is in $D_j$ and (s, x) is in $\delta^{-1}(D_j)$ and since $\delta(s, x)$ is in $\delta$ (s, x)=0, $\delta_j^{n-1}(s, x) = 0$.

$K_j(\delta(s, x)) = 1$ and $K_j[F(\delta(s, x))] = 1$. Since $\delta(s, x)$ is not in $D_j$ and (s, x) is not in $\delta^{-1}(D_j)$ and since $\delta(s, x)$ is in $\delta$, $\delta_j^{n-1}(s, x) = 0$.

The correctness of the composition will now be shown. It must be checked that the following equation holds:

$$[(s,s') \in \forall x(\Delta^{-1}(E_{n-1}))] \Leftrightarrow \forall x(\delta^{n-1}(s) = \delta^{n-1}(s'))$$

Proposition 1: If $\psi$ p is a transitive and symmetrical relation from B into B defined anywhere, then $$\forall x, y((C(\psi)(x) = C(\psi)(y)) \Leftrightarrow ((x, y) \in \psi))$$

Proof:

⇒ Let $t = C(\psi)(x)$. By definition, two pairs (x, t) and (y, t) are in $\psi$. By symmetry, (t, y) is in $\psi$. Thus, by transitivity, (x, y) is in $\psi$.

⇐ Suppose that $C(\psi)(x) < C(\psi)(y)$ and that $(x, y) \in \psi$. By symmetry, (x, y) is in $\psi$. By transitivity, $(yC(\psi)(x))$ is in $\psi$. Now, $(yC(\psi)(x)) \in \psi$ is inconsistent with the assumption $C(\psi)(y) < C(\psi)(x)$.

Theorem 2: The composition $C(E_{n-1})$ o $\delta$ verifies the property of the equation to be shown.

The statement results from Proposition 1.

| | |
|---|---|
| $\forall x \in I [F(\delta(s, x)) = F(\delta(s', x))]$ | |
| $\Leftrightarrow \forall x \in I [(\delta(s, x), \delta(s', x)) \in E_{n-1}]$ | from Proposition 1 |
| $\Leftrightarrow \forall x \in I [(\delta(s, s', x)) \in E_{n-1}]$ | from definition of $\delta$ |
| $\Leftrightarrow (s, s') \in (\forall x(\Delta^{-1}(E_{n-1}))$ | from a $\forall$-elimination of input variables |

Thus, a new algorithm allows to compute the set $E_n$ from $E_{n-1}$. The BDD is the graph of an equivalence relation on S×S. The set $E_{n-1}$ is built on boolean variables $s_1, s_2, \ldots, s_n, s'_1, s'_2, \ldots, s'_n$ where $s_i$ encodes the first component of pairs of S×S, the $s'_i$ encoding the second component of pairs of S×S. First, the BDD of the graph of the canonical application of this equivalence relation is built and named $C(E_{n-1})$. $C(E_{n-1})$ is built on the boolean variables $s_1, s_2, \ldots, s_n, s'_1, s'_2, \ldots, s'_n$, in which the $s_i$ encode the first component of pairs of S×S and the $s'_i$ encode the second component.

Let $\psi$ be a function of the type S×S having a graph $C(E_{n-1})$. From the BDD of $C(E_{n-1})$ and transition function $\delta$ is computed vector $\delta^{n-1}$ in accordance with the method of the invention. The vector $\delta^{n-1}$ is built by renaming the variables s into s'. Then is computed the set $\forall x(\delta^{n-1} \Leftrightarrow \delta'^{n-1})$. The set $E_n$ is the intersection of this latter set built on the variables $s_1, s_2, \ldots, s_n, s'_1, s'_2, \ldots, s'_n$ and set $E_1$. Thus, the set $\forall x(\Delta^{-1}(E_{n-1}))$ is built from $\delta^{n-1}$ in the same manner as $E_1$ is constructed from $\Delta$. Finally, the set $E_n$ is equal to $(\forall x(\Delta^{-1}(E_{n-1})) \wedge E_1)$.

The following second algorithm is given for the iterative step. This algorithm takes as input the BDD of $E_{n-1}$ and the list of variables $(s'_1, s'_2, \ldots, s'_n)$ used for a copy of state variables and for the range of cross-section $C(E_{n-1})$. The returned result is the BDD of $(E_{n-1})$. Both $E_n$ and $E_{n-1}$ have variable support $s_1, s_2, \ldots, s_n, s'_1, s'_2, \ldots, s'_n$. The algorithm 2 is:

```
IterativeStep(E, s') {
    proj = CrossSection(E, s');
    for (j≤n) {
        dif  = ∃s'((¬s_j ⇔ s'_j) ∧ proj);
        ant  = δ^-1·(dif);
        case (j) {
            (1) {
                new_1 = δ_1 ⇔ ¬ant;
                new'_1 = new_1 [s ← s'];
                break;
            }
            [...]
            (n) {
                new_n = δ_n ⇔ ¬ant;
                new'_n = new_n [s ← s'];
                break;
            }
        }
    }
    pred = ∀x ∧ (new_j ⇔ new'_j);
           j≤1
    E_new = E_1 ∧ pred;
    return(E_new);
}
```

Comparison have been made between the algorithm of the present invention and the implementation of the prior art algorithm. The method of the invention enables less space complexity due the simplification of reverse image computation and generally allows better results in time. The following table shows the features of the testing models: circuit name of the ISCAS89—benchmarks -, number of variables (successively: inputs; outputs; states), number of vertices of all BDD's, number of equivalence classes and number of steps required for computation.

| circuit name | variables | vertices | equivalence classes | steps |
|---|---|---|---|---|
| s344 | 9 ; 11 ; 15 | 164 | 18608 | 5 |
| s1488 | 8 ; 19 ; 6 | 476 | 49 | 2 |
| s298 | 3 ; 6 ; 14 | 117 | 8061 | 16 |
| s382 | 3 ; 6 ; 21 | 174 | 608448 | 93 |

The following table show the results from the method of the invention compared with the prior method. CPU times are reported in seconds on an IBM RS-6000 Workstation.

| circuit | CPU time | | memory | |
| --- | --- | --- | --- | --- |
| name | invention | prior art | invention | prior art |
| s344 | 1.9 | 21.0 | 0.9 | 2.2 |
| s1488 | 1.0 | 12.7 | 0.6 | 1.7 |
| s298 | 8.5 | 286.4 | 1.6 | 7.5 |
| s382 | 480.6 | 2608.4 | 3.7 | 10.6 |

The vertices created for computation appear from the following table.

| circuit | vertices | |
| --- | --- | --- |
| name | invention | prior art |
| s344 | 27127 | 110314 |
| s510 | 16358 | 64387 |
| s1488 | 15935 | 97622 |
| s298 | 78210 | 1372970 |
| s382 | 2600773 | >3500000 |

DESCRIPTION OF THE PREFERRED EMBODIMENT

The method of the invention can be modified by a man skilled in the art to have a plurality of various embodiments. For example, a BDD can have several embodiments, in particular the so-called TDG (Typed Decision Graph) described for example in the book The Fusion between Hardware Design and Verification, G. Milne as publisher, North-Holland, part entitled "Original Concepts of PRIAM, An Industrial Tool for Efficient Formal Verification of Combinational Circuits". Any form of BDD can be used by the present invention. Furthermore, although the ordering of all the BDD's is assumed to be: $s_1 < s'_1 < s_2 < \ldots < s_n < s'_n$, another ordering can be used and the method can be modified accordingly. Also, although the description of the above embodiment of the invention has been directed to compute the set $\forall x(\Delta^{-1}(E_{n-1}))$, it has been shown that the invention can be extended to any quantification of each variable of x.

Also, although the method of the invention is a solution to a problem raised by a finite state machine applied to hardware design and verification, it can be extended to be a method of verification of a sequential machine having finite states, since a finite state machine is software sequential machine. For example, the method can be used for protocol verification, control interface verification and more generally for the verification of software program portions having finite states. Also, it is clear that the invention can be applied for verification of a hardware sequential machine such as a sequencer and an automated machine having finite states. The meaning of word "verification" includes that of test which is to verify whether required conditions are satisfied.

Furthermore, although the above preferred embodiment shows that the method of the present invention uses an iterative computation from $E_{n-1}$, it is obvious that the present invention can be used without iterative computation and for any quantification of each variable.

As a result, the method of the invention can be defined as a method of verification of a finite state sequential machine, comprising computing by means of a data processing machine a set Y defined from two finite sets B and S encoded on boolean variables, a function $\delta: B \rightarrow S$ expressed by a vector of boolean functions and an equivalence relation A on S, the set B being encoded on variables $s=s_1, \ldots, s_n$ and $x=x_1, \ldots, x_k$, in which x can be void, and $Qx_i$ designating either $\exists_i$ or $\forall x_i$, so that:

$$Y=\{(s,s') \in (\exists x_1, \ldots, \exists x_k B)^2 | Qx_1, \ldots, Qx_k [(\delta(s,x), \delta(s', x)) \in A]\},$$

characterized in that the computation of set Y comprises the steps of (a) constructing in a canonical way, from the BDD of the graph of the equivalence relation A, the BDD of the graph of a total function from S×S, named cross-section and denoted C(A), (b) constructing from the cross-section and the vector $\delta$ a new vector denoted $\delta^* = C(A) \circ \delta$, and (c) computing the pairs (s, s') such that $Qx1, \ldots .Qxk.(\delta^*(s, x) = \delta(s', x))$. In this definition, the sets B and S are any sets which can be different from the above sets B and S, the variables s and x are any variables which can be different form the above variables s and x, the equivalence relation A is any equivalence relation and the function $\delta$ can be another function than the transition function of a FSM. Since no iterative computation is made, the vector $\delta^*$ is used in lieu of $\delta^{n-1}$ in the iterative computation of the above embodiment. The equation for computation of Y is the algorithm of computation of a reverse image. Accordingly, the connection of this general definition with the method as described in the above embodiment can be made in defining the latter as a method used to compute an equivalence relation (E) of a finite state machine FSM, the equivalence relation (E) being defined as the fixpoint of a monotonic suite $E_1, \ldots, E_n = E$, the computation of the equivalence relation (E) being made by successively constructing the set $E_n$ by use of the reverse image of $E_{n-1}$ defined in terms of said set Y.

In the above description of the preferred embodiment has been shown that the canonical cross-section used in the above step (a) can be computed from the compatible projection using the following definition: let B and C be two sets and $\psi$ a relation from B into C and let $\leq$ be a total order on C, then the cross-section of $\psi$ is the partial function $C(\psi)$ defined as:

$$C(\phi): \quad |B \rightarrow C$$
$$|x \mapsto \min(\{y | (x, y) \in \phi\}).$$

In this definition is assumed that the increasing ordering of the variables. Another ordering and definition could be used. For example, another ordering can be used in replacing in the above definition "let $\leq$ be a total order on C" by "let < be a total strict order on C. Also, a computation from another method than the compatible projection can be used.

From theorem 1 in the preferred embodiment can also be shown that in step (b) in the general definition of the present invention the vector $\delta^*$ is built from vector $\delta$ and graph C(A), this graph being encoded on said variable $s=s_1, \ldots, s_n$ for the domain and on a variable $s'=s'_1, \ldots, s'_n$ for the codomain, while $\delta^*$ is built by using the sets $D_j = \exists s'(\neg(s_j \Leftrightarrow s'_j) \wedge C(A))$ and performing the reverse image computation uniquely for the sets $D_j$. The word "uniquely" is a consequence of the present invention.

The method can be carried out by a computer program of an information support such as a magnetic tape or disk and by a verification tool.

I claim:

1. A method of verification of a finite state sequential machine, comprising the steps of:
   determining a set Y using a data processor, said set Y being defined from two finite sets B and S encoded on boolean variables, a function $\delta:B \rightarrow S$ expressed by a vector of boolean functions, and an equivalence relation A on S, the set B being encoded on variables $s=s_1, \ldots, s_n$ and $x=x_1, \ldots, x_k$, in which x can be void, and $Qx_i$ designating either $\exists x_i$ or $\forall x_1$, so that:

$Y=\{(s,s') \in (\exists x_1, \ldots, \exists x_k B)^2 | Qx_1, \ldots, Qx_k ((\delta(s,x), \delta(s', x)) \in A)\}$, wherein the determination of set Y comprises the steps of:

(a) constructing in a canonical way, from a binary decision diagram (BDD) of a graph of the equivalence relation A, the BDD of a graph of a total function from S×S, named cross-section and denoted C(A);

(b) constructing from the cross-section C(A) and the vector $\delta$ a new vector denoted $\delta^* = C(A) \circ \delta$; and (c) computing the pairs (s,s') such that $Qx1, \ldots Qxk \cdot (\delta^*(s,x) = \delta(s',x))$; and verifying with said data processor an operation of said finite state sequential machine based on an equivalence relation of the pairs (s,s').

2. The method according to claim 1, further comprising computing an equivalence relation E of a finite state machine (FSM), the equivalence relation E being defined as the fixpoint of a monotonic suite $E_1, \ldots, E_n = E$, the computation of the equivalence relation E being made by successively constructing the set $E_n$ by use of the reverse image of the set $E_{n-1}$ defined in terms of said set Y and corresponding to $\Delta^{-1}(E_{n-1})$.

3. The method according to claim 1, characterized in that said step (a) is computed from a compatible projection in which the following definition is used: let B and C be two sets and $\psi$ a relation from B into C and let < be a total strict order on C, then the cross-section of $\psi$ is the partial function $C(\psi)$ defined as:

$$C(\phi): |B \to C$$
$$|x \mapsto \min(\{y | (x, y) \in \phi\}).$$

4. The method according to claim 1, characterized in that said step (a) is computed from a compatible projection in which the following definition is used: let B and C be two sets and $\psi$ a relation from B into C and let $\leq$ be a total order on C, then the cross-section of $\psi$ is the partial function $C(\psi)$ defined as:

$$C(\phi): |B \to C$$
$$|x \mapsto \min(\{y | (x, y) \in \phi\})$$

and the order is selected to be a successive increasing order.

5. The method according to claim 1, characterized in that in the step (b), the vector $\delta^*$ is built from the vector $\delta$ and the graph C(A), said graph being encoded on a variable $s=s_1, \ldots, s_n$ for the domain and on a variable $s'=s'_1, \ldots s'_n$ for the codomain, and $\delta^*$ is also built by using the sets $D_j = \exists s'(\neg(s_j \Leftrightarrow s'_j) \wedge C(A)$ and performing a reverse image computation uniquely for the sets Dj.

6. The method according to claim 2, characterized in that said step (b) comprises constructing from said cross-section and said vector $\delta$ a new vector $\delta^{n-1} = C(E_{n-1}) \circ \delta$.

7. The method according to claim 6, characterized in that it further comprises a step (c) of computing equivalent pairs of states with respect to the vector $\delta^{n-1}$ to have the pairs of $(\forall x \Delta^{-1} (E_{n-1}))$.

8. A computer implemented method of verification of a finite state sequential machine, comprising:

computing by means of a data processor a set Y defined from two finite sets B and S encoded on boolean variables, a function $\delta: B \to S$ expressed by a vector of boolean functions, and an equivalence relation A on S, the set B being encoded on variables $s=s_1, \ldots, s_n$ and $x=x_1, \ldots, x_k$, in which x can be void, and $Qx_i$ designating either $\exists x_i$ or $\forall x_i$, so that:

$Y=\{(s,s') \in (\exists x_1, \ldots, \exists x_k B)^2 | Qx_1, \ldots, Qx_k ((\delta(s,x), \delta(s', x)) \in A)\}$, characterized in that the: computation of set Y comprises the steps of:

(a) constructing in a canonical way, from a binary decision diagram (BDD) of a graph of the equivalence relation A, the BDD of a graph of a total function from S×S, named cross-section and denoted C(A);

(b) constructing from the cross-section C(A) and the vector $\delta$ a new vector denoted $\delta' = C(A) \circ \delta$: and (c) computing the pairs (s,s') such that $Qx1, \ldots Qxk \cdot (\delta^*(s,x) = \delta(s',x))$; and verifying with said data processor an operation of said finite state sequential machine based on an equivalence relation of the pairs (s,s').

9. A tool for verification of a finite state sequential machine, characterized in that it carries out a method of verification of the finite state sequential machine, comprising:

determining a set Y using a data processor, said set Y being defined from two finite sets B and S encoded on boolean variables, a function $\delta: B \to S$ expressed by a vector of boolean functions, and an equivalence relation A on S, the set B being encoded on variables $s=s_1, \ldots, s_n$ and $x=x_1, \ldots, x_k$, in which x can be void and $Qx_i$ designating either $\exists x_i$ or $\forall x_i$, so that:

$Y=\{(s,s') \in (\exists x_1, \ldots, \exists x_k B)^2 | Qx_1, \ldots, Qx_k (\delta(s,x), \delta(s',x)) \in A)\}$, characterized in that the computation of set Y comprises the steps of:

(a) constructing in a canonical way, from a binary decision diagram (BDD) of a graph of the equivalence relation A, the BDD of a graph of a total function from S×S, named cross-section and denoted C(A);

(b) constructing from the cross-section C(A) and the vector $\delta$ a new vector denoted $\delta^* = C(A) \circ \delta$; and (c) computing the pairs (s,s') such that $Qx1, \ldots Qxk \cdot (\delta^*(s,x) = \delta(s',x))$; and verifying with said data processor an operation of said finite state sequential machine based on an equivalence relation of the pairs (s,s').

10. The method according to claim 2, characterized in that said step (a) is computed from a compatible projection in which the following definition is used: let B and C be two sets and $\psi$ a relation from B into C and let < be a total strict order on C, then the cross-section of $\psi$ is the partial function $C(\psi)$ defined as:

$$C(\phi): |B \to C$$
$$|x \mapsto \min(\{y | (x, y) \in \phi\}).$$

11. The method according to claim 2, characterized in that said step (a) is computed from a compatible projection in which the following definition is used: let B and C be two sets and $\psi$ a relation from B into C and let $\leq$ be a total order on C, then the cross-section of $\psi$ is the partial function $C(\psi)$ defined as:

$$C(\phi): |B \to C$$
$$|x \mapsto \min(\{y | (x, y) \in \phi\})$$

and the order is selected to be a successive increasing order.

12. The method according to claims 2, characterized in that said step (b), the vector $\delta^*$ is built from the vector $\delta$ and the graph C(A), said graph being encoded on a variable $s=s_1, \ldots, s_n$ for the domain and on a variable $s'=s'_1, \ldots, s'_n$ for the codomain, and $\delta'$ is also built by using the sets $D_j=\exists s'(\neg(s_j \Leftrightarrow s'_j)) \wedge C(A)$ and performing a reverse image computation uniquely for the sets Dj.

13. The method according to claim 3, characterized in that said step (b), the vector $\delta^*$ is built from the vector $\delta$ and the graph C(A), said graph being encoded on a variable $s=s_1, \ldots, s_n$ for the domain and on a variable $s'=s'_1, \ldots, s_n$ for the codomain, and $\delta^*$ is also built by using the sets $D_j=\exists s'(\neg(s_j \Leftrightarrow s'_j)) \wedge C(A)$ and performing a reverse image computation uniquely for the sets Dj.

14. The method according to claim 4, characterized in that said step (b), the vector $\delta^*$ is built from the vector $\delta$ and the graph C(A), said graph being encoded on a variable $s=s_1, \ldots, s_n$ for the domain and on a variable $s'=s'_1, \ldots, s'_n$ for the codomain, and $\delta^*$ is also built by using the sets $D_j=\exists s'(\neg(s_j \Leftrightarrow s'_j)) \wedge C(A)$ and performing a reverse image computation uniquely for the sets Dj.

15. The method according to claim 5, characterized in that said step (b), the vector $\delta^*$ is built from the vector $\delta$ and the graph C(A), said graph being encoded on a variable $s=s_1, \ldots, s_n$ for the domain and on a variable $s'=s'_1, \ldots, s'_n$ for the codomain, and $\delta^*$ is also built by using the sets $D_j=\exists s'(\neg(s_j \Leftrightarrow s'_j)) \wedge C(A)$ and performing a reverse image computation uniquely for the sets Dj.

16. The method according to claim 3, characterized in that said step (b) comprises constructing from said cross-section and said vector $\delta$ a new vector $\delta^{n-1}=C(E_{n-1})o\delta$.

17. The method according to claim 4, characterized in that said step (b) comprises constructing from said cross-section and said vector $\delta$ a new vector $\delta^{n-1}=C(E_{n-1})o\delta$.

18. The method according to claim 5, characterized in that said step (b) comprises constructing from said cross-section and said vector $\delta$ a new vector $\delta^{n-1}=C(E_{n-1})o\delta$.

19. The method of claim 16, characterized in that said step, (b) comprises constructing from said cross-section and said vector $\delta$ a new vector $\delta^{n-1}=C(E_{n-1})o\delta$.

20. The method of claim 17, characterized in that said step (b) comprises constructing from said cross-section and said vector $\delta$ a new vector $\delta^{n-1}=C(E_{n-1})o\delta$.

21. The method of claim 18, characterized in that said step (b) comprises constructing from said cross-section and said vector $\delta$ a new vector $\delta^{n-1}=C(E_{n-1})o\delta$.

* * * * *

UNITED STATES PATENT AND TRADEMARK OFFICE
CERTIFICATE OF CORRECTION

PATENT NO. : 5,594,656
DATED : January 14, 1997
INVENTOR(S) : Thomas TAMISIER

It is certified that error appears in the above-indentified patent and that said Letters Patent is hereby corrected as shown below:

[57] ABSTRACT - Last Line-- "$(\forall x \Delta^{-1}(E_{n-1})$" should be -- $(\forall x \Delta^{-1}(E_{n-1}))$ --

Col. 2, line 23, "$E \subset E_j \subset E_i \subset S \times S$" should be -- $E \subseteq E_j \subseteq E_i \subseteq S \times S$ --

Col. 2, line 28, "$\subset$" should be -- $\subseteq$ --

Col. 2, line 30, "$\psi$" should be -- $\varphi$ --

Col. 2, line 32, "$\psi$" should be -- $\varphi$ --

Col. 2, line 35, "$\psi$" should be -- $\varphi$ --

Col. 2, line 36, "$\psi$" should be -- $\varphi$ --

Col. 2, line 40, "$\psi$" should be -- $\varphi$ --

Col. 2, line 41, "$\psi$" should be -- $\varphi$ --

Col. 2, line 44, "$\psi$" should be -- $\varphi$ --

Col. 2, line 46, "$\psi$" should be -- $\varphi$ --

Col. 2, line 51, "$\psi$" should be -- $\varphi$ --

Col. 2, line 64, "$\delta(x_1,\ldots,x_n)=[\delta_1,\ldots,x_n),$" should be -- $\delta(x_1,\ldots,x_n)=[\delta_1(x_1,\ldots,x_n),$ --

Col. 3, line 55, $\Delta=(\delta_1,\ldots,\delta'_1,\ldots,\delta_n,\delta'_1,\ldots,\delta'_n)$ should be -- $\Delta=(\delta_1,\ldots,\delta_n,\delta'_1,\ldots,\delta'_n)$ --

UNITED STATES PATENT AND TRADEMARK OFFICE
CERTIFICATE OF CORRECTION

PATENT NO. : 5,594,656
DATED : January 14, 1997
INVENTOR(S) : Thomas TAMISIER

It is certified that error appears in the above-indentified patent and that said Letters Patent is hereby corrected as shown below:

Col. 3, line 57, "$\lambda'_n$" should be -- $\lambda'_\ell$ --

Col. 4, line 3, "$P \subset \{0,1\}^k$" should be -- $P \subseteq \{0,1\}^k$ -- and "$\delta^{-1}(P) \subset \{0,1\}^n = \{(x_1,$" should be -- $\delta P^{-1}(P) \subseteq \{0,1\}^n = \{(x_1,$ --

Col. 4, line 36, "$E_{n\text{-}}$" should be -- $E_{n-1}$ --

Col. 4, line 67, "$\forall_i$" should be -- $\forall x_i$ --

Col. 6, line 29, "$\psi$" should be -- $\varphi$ --

Col. 6, line 31, "$\psi$" should be -- $\varphi$ -- (both occurrences)

Col. 6, line 33, "$C(\phi)$" should be -- $C(\varphi)$ --

Col. 6, line 34, "$\phi$" should be -- $\varphi$ --

Col. 7, line 9, "$\delta_1^{n-1}(s,x) = K_j(C(E_{n-1})(\delta(s,x)))$" should be -- $\delta_1^{n-1}(s,x) = K_j[C(E_{n-1})(\delta(s,x))]$ --

Col. 7, line 15, "$D_j \subset S$" should be -- $D_j \subseteq S$ --

Col. 7, line 43, "$\psi$ p" should be -- $\varphi$ --

Col. 7, line 47, "$\psi$" should be -- $\varphi$ -- (all occurrences)

Col. 7, line 49, "$(\psi)$" should be -- $\varphi$ --

Col. 7, line 50, "$(\psi)$" should be -- $\varphi$ -- (both occurrences)

Col. 7, line 51, "$(\psi)$" should be -- $\varphi$ --

UNITED STATES PATENT AND TRADEMARK OFFICE
CERTIFICATE OF CORRECTION

PATENT NO. : 5,594,656
DATED : January 14, 1997
INVENTOR(S) : Thomas TAMISIER

It is certified that error appears in the above-indentified patent and that said Letters Patent is hereby corrected as shown below:

Col. 7, line 52, "($\psi$)" should be -- $\varphi$ -- (all occurrences)

Col. 7, line 53, "($\psi$)" should be -- $\varphi$ -- (all occurrences)

Col. 7, line 54, "($\psi$)" should be -- $\varphi$ -- (both occurrences)

Col. 7, line 55, "($\psi$)" should be -- $\varphi$ -- (both occurrences)

Col. 8, line 10, "$\psi$" should be -- $\varphi$ --

Col. 10, line 3, "$\exists$" should be -- $\exists x_i$ --

Col. 10, line 36, "$\psi$" should be -- $\varphi$ --

Col. 10, line 37, "$\psi$" should be -- $\varphi$ -- (both occurrences)

Col. 10, line 39, "C($\phi$)" should be -- C($\varphi$) --

Col. 10, line 41, "$\phi$" should be -- $\varphi$ --

Col. 11, line 3, (Claim 1) "$\forall x_1$" should be -- $\forall x_i$ --

Col. 11, line 30, (Claim 3) "$\psi$" should be -- $\varphi$ --

Col. 11, line 31, (Claim 3) "$\psi$" should be -- $\varphi$ --

Col. 11, line 32, (Claim 3) "$\psi$" should be -- $\varphi$ --

Col. 11, line 34, (Claim 3) "C($\phi$)" should be -- C($\varphi$) --

Col. 11, line 35, (Claim 3) "$\phi$" should be -- $\varphi$ --

UNITED STATES PATENT AND TRADEMARK OFFICE
CERTIFICATE OF CORRECTION

PATENT NO. : 5,594,656
DATED : January 14, 1997
INVENTOR(S) : Thomas TAMISIER

It is certified that error appears in the above-indentified patent and that said Letters Patent is hereby corrected as shown below:

Col. 11, line 40, (Claim 4) "$\psi$" should be -- $\varphi$ --

Col. 11, line 41, (Claim 4) "$\psi$" should be -- $\varphi$ -- (both occurrences)

Col. 11, line 44, (Claim 4) "C($\phi$)" should be -- C($\varphi$) --

Col. 11, line 45, (Claim 4) "$\phi$" should be -- $\varphi$ --

Col. 12, line 5, (Claim 8), delete ":"

Col. 12, line 13, (Claim 8) "$\delta'$=C(A)o$\delta$:" should be -- $\delta$*=C(A)o$\delta$; --

Col. 12, line 48, (Claim 10) "$\psi$" should be -- $\varphi$ --

Col. 12, line 49, (Claim 10) "$\psi$" should be -- $\varphi$ --

Col. 12, line 50, (Claim 10) "$\psi$" should be -- $\varphi$ --

Col. 12, line 52, (Claim 10) "C($\phi$)" should be -- C($\varphi$) --

Col. 12, line 53, (Claim 10) "$\phi$" should be -- $\varphi$ --

Col. 12, line 58, (Claim 11) "$\psi$" should be -- $\varphi$ --

Col. 12, line 59, (Claim 11) "$\psi$" should be -- $\varphi$ -- (both occurrences)

Col. 12, line 62, (Claim 11) "C($\phi$)" should be -- C($\varphi$) --

Col. 12, line 63, (Claim 11) "$\phi$" should be -- $\varphi$ --

Col. 13, line 3, (Claim 12) "$\delta'$" should be -- $\delta$* --

UNITED STATES PATENT AND TRADEMARK OFFICE
CERTIFICATE OF CORRECTION

PATENT NO. : 5,594,656
DATED : January 14, 1997
INVENTOR(S) : Thomas TAMISIER

It is certified that error appears in the above-indentified patent and that said Letters Patent is hereby corrected as shown below:

Col. 14, line 2, (Claim 15) "$D_j = \exists s'(\neg(s_j = \leftrightarrow s'_j) \wedge C(A)$" should be -- $D_j = \exists s'(\neg(s_j \leftrightarrow s'_j) \wedge C(A)$ --

Col. 14, line 14, (Claim 19) after "step", delete -- , --

Signed and Sealed this

Eighteenth Day of August, 1998

Attest:

BRUCE LEHMAN

Attesting Officer

Commissioner of Patents and Trademarks